United States Patent [19]
Mul

[11] Patent Number: 5,235,188
[45] Date of Patent: Aug. 10, 1993

[54] CHARGED PARTICLE BEAM DEVICE

[75] Inventor: Petrus M. Mul, Eindhoven, Netherlands

[73] Assignee: U.S. Philips Corporation, New York, N.Y.

[21] Appl. No.: 741,282

[22] Filed: Aug. 7, 1991

[30] Foreign Application Priority Data

Aug. 10, 1990 [NL] Netherlands .............. 9001799

[51] Int. Cl.⁵ .......................... H01J 37/26
[52] U.S. Cl. .............................. 250/311
[58] Field of Search ............ 250/311, 310, 423 F, 250/396 R; 313/363.1

[56] References Cited

U.S. PATENT DOCUMENTS

| | | | |
|---|---|---|---|
| 3,676,670 | 7/1972 | Dao | 250/311 |
| 3,678,333 | 7/1972 | Coates et al. | 250/311 |
| 3,691,377 | 9/1972 | Matsui et al. | 250/311 |
| 3,766,427 | 10/1973 | Coates et al. | 250/311 |
| 3,808,498 | 4/1974 | Fujisawa | 250/311 |
| 3,809,899 | 5/1974 | Baker et al. | 250/311 |
| 3,895,254 | 7/1975 | Minamikawa et al. | 250/311 |
| 5,059,859 | 10/1991 | Endo et al. | 250/396 R |

*Primary Examiner*—Bruce C. Anderson
*Attorney, Agent, or Firm*—Leroy Eason

[57] ABSTRACT

In a charged particle beam device, comprising a charged particle source for emitting a charged particle beam, a column comprising particle-optical elements which are enclosed by a column jacket and which serve to accelerate and focus the charged particle beam, the charged particle source comprising an emitter which is accommodated in an emitter chamber, a vibration-insensitive suspension of the emitter is achieved by connecting the emitter chamber to the column jacket via a tubular electrode system. Because the pumping device cooperating with the emitter chamber is arranged above the emitter chamber and in the prolongation of the column, disturbing effects of the pumping device on the emitter are reduced. Because the power supply unit is arranged in the vicinity of the emitter, high-voltage supply leads can be dispensed with, so that interference signals cannot reach the emitter via the supply leads. The use of optical communication via optical fibres prevents the occurrence of undesirable potentials in the equipment.

12 Claims, 2 Drawing Sheets

CHARGED PARTICLE BEAM DEVICE

BACKGROUND OF THE INVENTION

The invention relates to a charged particle beam device, comprising a charged particle source for emitting a charged particle beam, a column provided with particle-optical elements which are enclosed by a column jacket and which serve to accelerate and focus the charged particle beam, the charged particle source comprising an emitter which is accommodated in an emitter chamber.

A charged particle beam device of this kind is known from: C. J. Rakels, J. C. Tiemeijer and K. W. Witteveen; "The Philips electron microscope EM 300", Philips Technical Review, Vol. 29, 1968, pp. 370–386.

The cited article describes an electron microscope in which the electron source, comprising a point-shaped emitter, accommodated in an emitter chamber, and a Wehnelt cylinder, is suspended from the column jacket by way of its side which is remote from the column. This has a drawback in that the electron source is sensitive to vibrations which are transmitted via the column jacket and which cause the electron source to move with respect to the column. A further source of interference is formed by electromagnetic fields. Despite the shielding of the electron source by the column jacket which is made of, for example, soft iron, electromagnetic fields are capable of disturbing the electron emission by the source, thus affecting the imaging. Another source of interference may be the supply leads for the high voltage of the electron source. Parasitic signals which reduce the emission stability of the source, may occur on said supply leads.

When use is made of a thermal electron source having an emitter of, for example, W or $LaB_6$, a crossover of the electron beam has a diameter of 10–20 $\mu$m. As a result, such an electron source is less sensitive to vibrations than, for example, a field emission source such as a cold field emitter or a thermal field emitter (a Schottky field emitter) having a virtual source with a diameter of a few nm. The field emission sources also require a higher vacuum than thermal electron sources, for example, $10^{-9}$–$10^{-10}$ Torr, so that additional pumping capacity is required which itself may cause additional mechanical or electromagnetic vibrations. It is inter alia an object of the invention to provide a charged particle beam device in which the charged particle source is free from mechanical and electromagnetic disturbances.

SUMMARY OF THE INVENTION

To achieve this, a charged particle beam device in accordance with the invention is characterized in that the emitter chamber is secured to a tubular electrode system which is coaxial with the column and which is rigidly connected to the column jacket.

When the emitter chamber is connected to the column via the tubular electrode system, a rigid construction is obtained which reduces the possibility of movement of the charged particle source with respect to the column. The electrode system accelerates the charged particle beam to, for example, an energy which can be adjusted in a range from 20 to 300 keV. In combination with the charged particle source, for example, a thermal field emitter comprising a 3-electrode electrostatic lens in the Schottky mode, the electrode system offers a stable, enlarged image of the virtual source of the charged particle beam at the exit of the electrode system.

An embodiment of a charged particle beam system in accordance with the invention is characterized in that the tubular electrode system comprises a flange which bears against a flange of the column jacket.

Via a flange, a rigid connection of the electrode system to the column is achieved, it being possible to uncouple the column from the electrode system for maintainance purposes.

A further embodiment of a charged particle beam device in accordance with the invention, comprising a charged particle source for emitting a charged particle beam, a column provided with particle-optical elements which are enclosed by a column jacket and which serve to accelerate and focus the charged particle beam, the charged particle source comprising an emitter which is accommodated in an emitter chamber, is characterized in that at a side of the emitter chamber which is remote from the column there is secured a pumping device which cooperates with the emitter chamber and which is situated in the prolongation of the column.

Arrangement of the pumping device in the prolongation of the column reduces the volume to be evacuated, because a connection lead can be dispensed with. Moreover, the transmission of mechanical vibrations from the pump to the column is reduced. When the pumping device comprises an ionization pump, the arrangement of the pump in the prolongation of the column is attractive because due to the symmetry of the magnetic fields present in the ionization pump with respect to the longitudinal axis of the column, the effect of these fields on the charged particle source is only slight.

A further embodiment of a charged particle beam device in accordance with the invention is characterized in that the pumping device is surrounded by a shielding electrode which is connected to the emitter chamber, the shielding electrode being situated within an envelope which is rigidly connected to the column jacket.

The shielding electrode, being free from sharp corners or edges, counteracts a discharge between points of the pumping device and the envelope across which a voltage difference of, for example, 200 kV is present. The shielding electrode also serves to shield the magnetic fields of the ionization pump.

Another embodiment of a charged particle beam device in accordance with the invention, comprising a charged particle source for emitting a charged particle beam, a column provided with particle-optical elements which are enclosed by a column jacket and which serve to accelerate and focus the charged particle beam, the charged particle source comprising an emitter which is accommodated in an emitter chamber, is characterized in that the charged particle beam device comprises a power supply unit which is arranged substantially at the level of the emitter chamber, transversely of the longitudinal axis of the column, and which is electrically connected to the charged particle source.

A power supply source is connected to the charged particle source and the electrode system for the acceleration of the charged particle and for adjustment of the beam current. When the power supply unit is arranged in the immediate vicinity of the charged particle source and the electrode system, high-voltage cables can be dispensed with between the power supply unit and the charged particle source and the electrode system, so that the risk of parasitic reception of interference signals via the high-voltage cables is reduced. Furthermore, from an economical point of view it is very advantageous that multi-core high-voltage cables (for example, five-core cables) which are very expensive can be dispensed with.

Another embodiment of a charged particle beam device in accordance with the invention is characterized in that the power supply unit is electrically connected to the charged particle source by way of resilient contacts.

The resilient contacts enable a relative movement of the power supply unit with respect to the charged particle source, without mechanical vibrations causing a displacement of the charged particle source via the power supply unit.

Another embodiment of a charged particle beam device in accordance with the invention is characterized in that the charged particle beam device comprises a control unit which is connected to the power supply unit, via an optical fibre, in order to adjust the supply voltage and supply current values.

Via the optical fibre, control signals of the control unit operating at a low voltage are applied to the power supply unit operating at a high voltage, without the voltage difference being bridged via a current conductor. Automatic control of the power supply unit by means of, for example, a computer is thus facilitated.

A further embodiment of a charged particle beam device in accordance with the invention is characterized in that the power supply unit is enclosed by an envelope which is rigidly connected to the column jacket and is secured to walls of the envelope.

The power supply unit is preferably suspended in an envelope which insulates the power supply unit from the environment, protects it against shocks and shields the electromagnetic fields generated by the power supply unit. Via a gas present in the space enclosed by the envelope, for example, SF6, heat developed in the power supply unit can be carried off.

BRIEF DESCRIPTION OF THE DRAWING

An embodiment of a charged particle beam device in accordance with the invention will be described in detail hereinafter with reference to the accompanying drawing. Therein.

DETAILED DESCRIPTION OF THE PREFERRED EMBODIMENT

Figure 1:
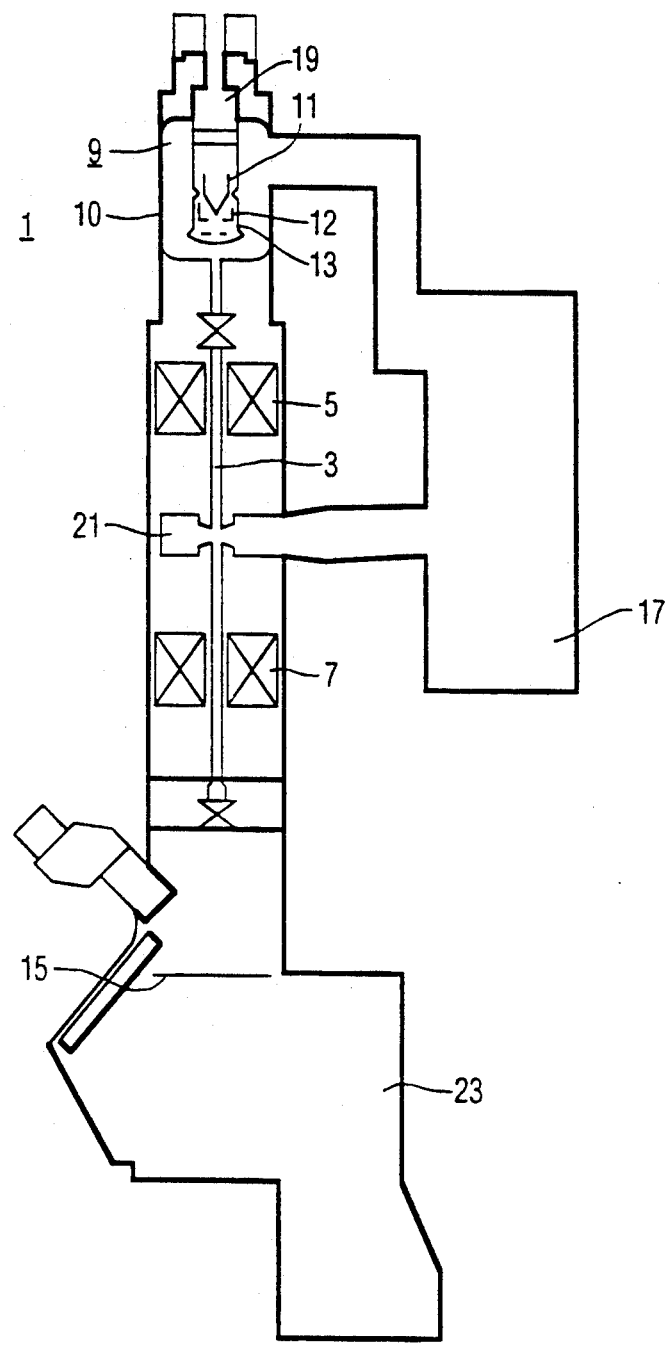
FIG. 1 diagrammatically shows a known charged particle beam device.

FIG. 1 shows a charged particle beam device in the form of an electron microscope 1 which comprises a column 3 along which there are arranged particle-optical elements, notably electron lenses 5 and 7. An electron source 9, comprising an emitter in the form of a thermal cathode 11 with, for example, a needle of W or LaB$_6$, and a Wehnelt electrode 12, emits an electron beam with an adjustable current in the order of magnitude of a few nA and a crossover with a diameter of, for example, 10 μm. The beam current can be adjusted by variation of the voltage across the Wehnelt electrode. An anode system 13 accelerates the electrons emitted by the cathode 11 to an energy of, for example, a few hundreds of keV, the voltage across the anodes 13 being increased, via a power supply unit not shown in the Figure, from 20 to 200 or 300 kV in steps of 20 kV. Via the column 3, the electron beam is imaged on an object arranged within an object chamber 21 by means of the electron lenses which are diagrammatically represented by the lenses 5 and 7 but which may comprise a dual condensor system, an objective lens, a diffraction lens, an intermediate lens and a projection system, after which the electrons transmitted by the object are incident on an image surface 15, for example, a photographic plate, the object being imaged with an enlargement of, for example, 800.000. According to a different method of imaging, utilizing a scanning electron microscope (SEM), the electron beam is focused on an object arranged in the object chamber 21 in a point-shaped manner and is raster-like deflected across the object. The electrons originating from an irradiated point of the object are detected and the detection signal is displayed on a television monitor in synchronism with the scanning of the electron beam across the object. Via an ionization pump 17, a pressure in the emitter chamber 19 is made equal to $10^{-7}$ Torr. An oil diffusion pump 23 realises a vacuum of the order of magnitude of $10^{-4}$ Torr in the space of the image face 15.

For exact imaging of an object it is not only necessary for the electron lenses to be stable, but the electron source 9 should not be disturbed by mechanical vibrations, electromagnetic fields and disturbances in the supply voltage, notably when a thermal field emitter is used. Because the emitter chamber 19 is non-rigidly connected to the column jacket 10 by way of a side which is remote from the column 3, relative displacement of the emitter chamber 19 with respect to the column 3 is possible; this is liable to disturb the imaging. Moreover, electromagnetic fields from neighbouring electronic circuitry are liable to disturb the operation of the source 9. Furthermore, interference which enters via the supply leads for the high voltage for the electron source, not shown in the Figure, can also have an adverse effect on the stability of the electron beam.

Figure 2:
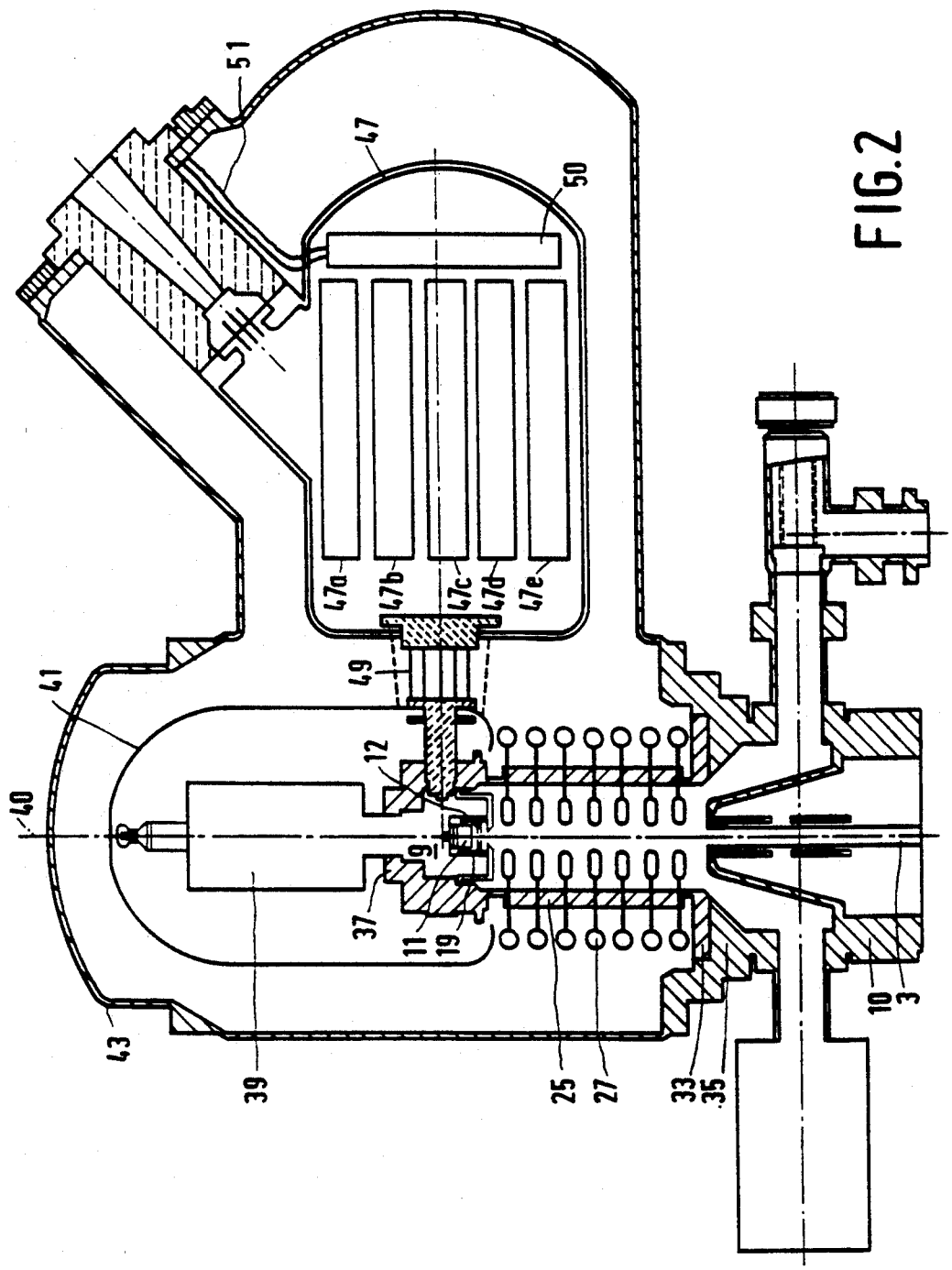
FIG. 2 is a lateral sectional view of an emitter chamber, a pumping device and a power supply unit in a charged particle beam device in accordance with the invention.

FIG. 2 shows the following parts of a charged particle beam device in accordance with the invention: the emitter chamber 19 with an emitter 11, for example, of the field emission type, which is rigidly connected to the column jacket 10 via a tubular electrode system 25. The electrode system 25 comprises the extraction anode 12, a focusing electrode, and further electrodes 27 for accelerating the electron beam. The electron system 25 comprises a flange 33 which bears against a flange 35 of the column jacket 10, so that the emitter chamber 19 and the electrode system 25 are rigid with respect to the column 3 and can be comparatively simply uncoupled therefrom, for example, for maintainance purposes.

At the side 37 of the emitter chamber 19 which is remote from the column 3 there is secured a pumping device 39 which reduces the pressure in the emitter chamber 19 to from $10^{-9}$ to $10^{-10}$ Torr. Because of the short distance between the emitter chamber 19 and the pumping device 39, supply lines between the pumping device and the emitter chamber may be short, thus reducing the space to be evacuated. When the pumping device 39 comprises an ionization pump as shown in the Figure, arrangement of the pumping device in the prolongation of the column 3 is attractive because the symmetry of the magnetic fields, generated by the ionization pump, with respect to the longitudinal axis 40 of the column 3 reduces the disturbing effect thereof on the emitter 11. The ionization pump 39 is enclosed by a shielding electrode 41 which is connected to the emitter chamber 19. The shielding electrode 41 serves to prevent electrical discharging between the pumping device 39 and the envelope 43. Transversely of the longitudinal axis 40 there is arranged a power supply unit 47 which is connected to the electron source 9 via resilient electrical contacts 49. The power supply unit 47 comprises a voltage source 47a which is connected to a focusing electrode which is situated near the emitter 11 and which is not shown in the Figure, a current source 47b for the supply of current to the emitter 11, voltage sources 47c and 47d for applying the extraction voltage to the extraction anode 12 and for applying a beam blanking voltage, and also a voltage source 47e which is connected to the ionization pump 39. The voltage and current source 47a-47e are controlled by a control unit 50. The resilient contacts 49 serve to supply the current to the emitter 11, the extraction voltage to the electrode 12, a voltage to the further electrodes, situated near the emitter 11, for focusing the electron beam, and a voltage to the pumping device 39 which is preferably an ionization pump. The control unit 50 is connected, via a light conductor in the form of an optical fiber system 51, to control unit, for example, a computer. The control unit applies adjustment values for the high voltage and the beam current of the electron source 19 and the electrode system 25 to the control unit 47 in the form of light signals. Because the power supply unit is arranged in the vicinity of the electron source 9, high-voltage cables for connecting the electron source and the power supply unit can be dispensed with. The risk of disturbing of the electron source via the high-voltage cables is thus reduced and the space available around the electron microscope is increased. The power supply unit is also surrounded by the envelope 43 which shields the external electromagnetic fields. Preferably, a thermally conductive gas having a high breakdown voltage, for example, SF6, is present within the envelope 43.

The invention is not restricted to scanning or transmission electron microscope, but can be used equally well for electron beam inspection devices for inspecting semiconductor circuits and for ion beam devices such as, for example, ion implantation devices and ion beam lithography devices.

I claim:

1. A charged particle beam device comprising a charged particle source for emitting a charge particle beam, a column provided with particle-optical elements which are enclosed by a column jacket and which serve to accelerate and focus the charged particle beam, the charged particle source comprising an emitter which is accommodated in an emitter chamber, characterized in that at a side of the emitter chamber which is remote from the column there is secured a pumping device which cooperates with the emitter chamber and which is situated in the prolongation of the column and in that the pumping device is surrounded by a shielding electrode which is connected to the emitter chamber, the shielding electrode being situated within a envelope which is rigidly connected to the column jacket.

2. A charged particle beam device as claimed in claim 1, characterized in that the tubular electrode system comprises a flange which bears against a flange of the column jacket.

3. A charged particle beam device as claimed in claim 1, characterized in that the pumping device comprises an ionization pump.

4. A charged particle beam device as claimed in claim 1, characterized in that the charged particle beam device comprises a power supply unit which is arranged substantially at the level of the emitter chamber, transversely of the longitudinal axis of the column, and which is electrically connected to the charged particle source.

5. A charged particle beam device as claimed in claim 1, characterized in that the power supply unit is electrically connected to the charged particle source by way of resilient contacts, via an opening in the shielding electrode.

6. A charged particle beam device as claimed in claim 4, characterized in that the charged particle beam device comprises a control unit which is connected to the power supply unit, via an optical fiber, in order to adjust the supply voltage and supply current values.

7. A charged particle beam device as claimed in claim 1, characterized in that the power supply unit is also enclosed by the envelope and is secured to a wall of the envelope.

8. A charged particle beam system as claimed in claim 1, characterized in that the space enclosed by the envelope is filled with a gas for heat conduction.

9. A charged particle beam device, comprising a charged particle source for emitting a charged particle beam, a column provided with particle-optical elements which are enclosed by a column jacket and which serve to accelerate and focus the charged particle beam, the charged particle source comprising an emitter which is accommodated in an emitter chamber, characterized in that the charged particle beam device comprises a power supply unit which is arranged substantially at the level of the emitter chamber, transversely of the longitudinal axis of the column, and which is electrically connected to the charged particle source and in that the power supply unit is enclosed by an envelope which is rigidly connected to the column jacket and is secured to the walls of the envelope.

10. A charged particle beam device as claimed in claim 9, characterized in that the power supply unit is electrically connected to the charged particle source by way of resilient contacts.

11. A charged particle beam device as claimed in claim 9, characterized in that the charged particle beam device comprises a control unit which is connected to the power supply unit via an optical fiber in order to adjust supply voltage and supply current values.

12. A charged particle beam device as claimed in claim 9, characterized in that the space enclosed by the envelope is filled with a gas for thermal conduction.

* * * * *